US012648178B2

(12) United States Patent
Bao et al.

(10) Patent No.: US 12,648,178 B2
(45) Date of Patent: Jun. 2, 2026

(54) NANOSHEET REPLACEMENT METAL GATE PATTERNING SCHEME

(71) Applicant: International Business Machines Corporation, Armonk, NY (US)

(72) Inventors: Ruqiang Bao, Niskayuna, NY (US); Jing Guo, Niskayuna, NY (US); Junli Wang, Slingerlands, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 690 days.

(21) Appl. No.: 17/529,115

(22) Filed: Nov. 17, 2021

(65) Prior Publication Data

US 2023/0154996 A1 May 18, 2023

(51) Int. Cl.
*H10D 30/67* (2025.01)
*H10D 30/01* (2025.01)
(Continued)

(52) U.S. Cl.
CPC ....... *H10D 30/6735* (2025.01); *H10D 30/031* (2025.01); *H10D 30/6757* (2025.01);
(Continued)

(58) Field of Classification Search
CPC ............. H10D 30/6735; H10D 30/031; H10D 30/6757; H10D 62/118; H10D 30/43;
(Continued)

(56) References Cited

U.S. PATENT DOCUMENTS

| | | | |
|---|---|---|---|
| 9,818,650 | B2 | 11/2017 | Doris |
| 10,103,065 | B1 | 10/2018 | Mochizuki |

(Continued)

FOREIGN PATENT DOCUMENTS

WO   2023/089469 A1   5/2023

OTHER PUBLICATIONS

Authorized Officer CAMPS, Ester,European Patent Office, counterpart PCT application PCT/IB2022/060930, Feb. 1, 2023. The International Search Report and the Written Opinion. pp. 18.

*Primary Examiner* — Yara B Green
*Assistant Examiner* — Benjamin Michael Kupp
(74) *Attorney, Agent, or Firm* — Seed Intellectual Property Law Group LLP

(57) ABSTRACT

A device includes a base layer structure including a first region and a second region; a first bottom gate material in a plurality of first-type doped regions in the first and second regions; a second bottom gate material in a second-type doped regions in the first and second regions; first nanosheet gate-all-round device structures on the first bottom gate material; and second nanosheet gate-all-round device structures on the second bottom gate material, wherein the first bottom gate material is located over the second nanosheet gate-all-around device structures in the second-type doped regions of the first and second regions, wherein the second bottom gate material extends, in boundary regions between the first-type and second-type doped regions, on the base layer structure from the second nanosheet gate-all-around devices structures toward the first gate-all-round device structures.

10 Claims, 13 Drawing Sheets

(51) Int. Cl.

| | |
|---|---|
| *H10D 62/10* | (2025.01) |
| *H10D 84/85* | (2025.01) |
| *H10W 90/00* | (2026.01) |

(52) U.S. Cl.

CPC ........... *H10D 62/118* (2025.01); *H10D 84/85* (2025.01); *H10W 90/00* (2026.01)

(58) Field of Classification Search

CPC .... H10D 62/121; H10D 84/038; H10D 84/85; H10D 84/0177; H10D 30/014; H10D 64/017; H10D 30/00; H10D 30/40; H10D 30/501–509; H10D 30/674; H10D 30/017; H10D 30/019–0198; H10D 30/0312; H10D 30/0318; H10D 80/00; H10D 80/20; H10D 80/211; H10D 80/213; H10D 80/215; H10D 80/231; H10D 80/251; H10D 80/30; H01L 25/074; H01L 21/02603; H01L 21/32139; H01L 21/3086; B82Y 10/00; H10B 10/12; H10B 80/00; H10W 90/00; H10W 90/10; H10W 90/15; H10W 90/155; H10W 90/20; H10W 90/22; H10W 90/231; H10W 90/24; H10W 90/26; H10W 90/271; H10W 90/275; H10F 39/90; H10F 39/95; H10H 29/20; H10H 29/24; H10H 29/30; H10H 29/32; H10H 29/34; H10H 29/345; H10H 29/352; H10H 29/362; H10H 29/37; H10H 29/39; H10H 29/41; H10H 29/45; H10H 29/49; H10K 19/00; H10K 19/10; H10K 19/20; H10K 19/201; H10K 19/202; H10K 19/80; H10K 19/901; H10K 39/601; H10K 39/621; H10K 59/90; H10K 59/95; H10K 65/00

See application file for complete search history.

(56) References Cited

U.S. PATENT DOCUMENTS

| | | | |
|---|---|---|---|
| 10,410,933 B2 | 9/2019 | Xie | |
| 10,510,620 B1 | 12/2019 | Chanemougame | |
| 10,566,248 B1 | 2/2020 | Chanemougame | |
| 10,600,694 B2 | 3/2020 | Mochizuki | |
| 10,615,257 B2 | 4/2020 | Ok | |
| 10,867,867 B2 * | 12/2020 | Chiang | ............. H01L 21/76232 |
| 10,950,610 B2 | 3/2021 | Paul | |
| 11,637,042 B2 * | 4/2023 | Chen | ................... H10D 64/017 |
| | | | 257/351 |
| 12,218,224 B2 * | 2/2025 | Huang | ............... H10D 84/0172 |
| 2019/0214311 A1 | 7/2019 | Seshadri | |
| 2020/0006356 A1 | 1/2020 | Ando | |
| 2020/0051872 A1 | 2/2020 | Guo | |
| 2020/0294863 A1 | 9/2020 | Chiang | |
| 2021/0082766 A1 | 3/2021 | Miura | |

* cited by examiner

100 nFET                    pFET                    nFET                    pFET nFET                    pFET                    nFET                    pFET nFET          pFET          nFET          pFET nFET          pFET          nFET          pFET nFET    pFET    nFET    pFET nFET    pFET    nFET    pFET nFET                    pFET            nFET                    pFET nFET                    pFET            nFET                    pFET

1801

204
1802 nFET          pFET          nFET          pFET

601

602

206

207 nFET          pFET          nFET          pFET nFET        pFET        nFET        pFET nFET   2103   2101   pFET        nFET    2102   pFET

NANOSHEET REPLACEMENT METAL GATE PATTERNING SCHEME

BACKGROUND

The present disclosure relates generally to nanosheet Replacement Metal Gate (RMG) patterning schemes.

A Field Effect Transistor (FET) typically includes a source, a channel, and a drain, where current flows from the source to the drain, and a gate controls the flow of current through the channel. FETs can be built in a variety of different configurations, including planar FET and FinFET configurations. In the case of a planar FET, the source, channel, and drain are formed in a substrate material, and the current flows horizontally along the channel (i.e., in the plane of the substrate). In the case of a FinFET, the channel extends outward from the substrate, where the current flows horizontally from a source to a drain. The channel for the FinFET can be an upright slab of thin rectangular silicon (Si), commonly referred to as the fin, with a gate on the fin, as compared to a metal-oxide-semiconductor field effect transistor (MOSFET) with a single gate parallel with the plane of the substrate.

N-type FETs or P-type FETs can be formed depending on the doping of the source and drain. Two FETs also can be coupled to form a complementary metal oxide semiconductor (CMOS) device, where a p-type MOSFET and n-type MOSFET are coupled together.

Nanosheet devices generally include stacks of channel layers, alternately including a nanosheet material, where the nanosheet material can be nanowire configured to conduct an electric current. Conventional techniques for patterning nanosheets produce nanosheets of the same size on the wafer, as the patterning is done using standard immersion lithography techniques that are limited in terms of critical dimensions (e.g., device width) that can be printed.

BRIEF SUMMARY

According to embodiments of the present invention, a device includes a base layer structure comprising a first region and a second region; a first bottom gate material directly on the base layer structure in a plurality of first-type doped regions in the first region and the second region; a second bottom gate material directed on the base layer structure in a plurality of second-type doped regions in the first region and the second region; a first plurality of nanosheet gate-all-round device structures on the first bottom gate material; and a second plurality of nanosheet gate-all-round device structures on the second bottom gate material, wherein the first bottom gate material is located over the second plurality of nanosheet gate-all-around device structures in the plurality of second-type doped regions of the first region and the second region, wherein the second bottom gate material extends, in boundary regions between the plurality of first-type doped regions and the plurality of second-type doped regions, on the base layer structure from the second plurality of nanosheet gate-all-around devices structures toward the first plurality of nanosheet gate-all-round device structures.

According to embodiments of the present invention, a method of manufacturing a device includes providing a base device comprising a first region and a second region, a base layer structure, a bottom gate material on the base layer structure, and a first plurality of nanosheet stacks in a first-type doped region in the first region and a second-type doped region in the first region and a second plurality of nanosheet stacks the first-type doped region in the second region and the second-type doped region in the second region, each of the first and second nanosheet stacks comprising a plurality of nanosheet channels surrounded by a first work function metal; depositing an organic planarizing layer; patterning the organic planarizing layer to expose the first plurality of nanosheet stacks in the first-type doped region in the first region and a portion of the first plurality of nanosheet stacks in the first-type doped region in the second region; removing the bottom gate material and a portion of the work function material in the first-type doped regions of the first region and the second region, including forming a first undercut region below the organic planarizing layer in the first region; removing the organic planarizing layer; deposing a second work function material over the device forming a gate-all-round (GAA) in the first-type doped regions of the first region and the second region; and depositing an interlevel dielectric cap over the device.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware mod-ule(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. Some embodiments may not have these potential advantages and these potential advantages are not necessarily required of all embodiments. For example, one or more embodiments may provide for:

n/p boundary control for multi-Vt definition;

printing a block boundary to extend to an open FET for narrow n/p space devices;

removal of a metal gate in a space between the nanosheets (Tsus) using tunneling etching.

These and other features and advantages of the present invention will become apparent from the following detailed description of illustrative embodiments thereof, which is to be read in connection with the accompanying drawings.

BRIEF DESCRIPTION OF THE DRAWINGS

Preferred embodiments of the present invention will be described below in more detail, with reference to the accompanying drawings.

DETAILED DESCRIPTION

Figure 1:
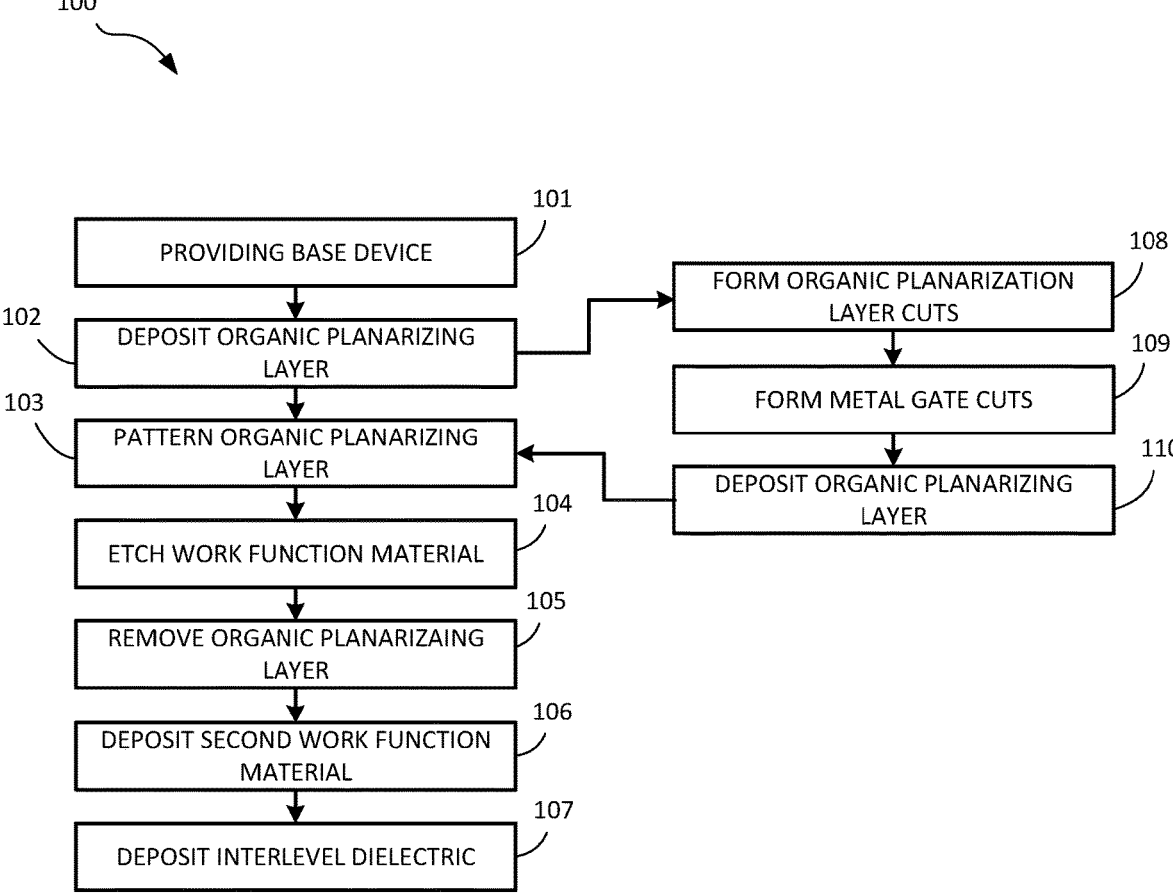
FIG. 1 is a Replacement Metal Gate (RMG) method of forming a nanosheet structure according to one or more embodiments of the present invention.

According to embodiments of the present invention, in a nanosheet structure having device regions with a narrow distance between nFET and pFET devices (n/p distance), such as Static Random-Access Memory (SRAM) and dense logic regions, a patterning boundary can be extended to open FETs, and for other device regions having larger n/p distances, the patterning boundary can be extended towards the open FETs, and up to the open FETs.

According to embodiments of the present invention, the gate metals in the open FETs are removed by etch (wet or dry), creating an undercut portion and an open FET work function metal are deposited to form a gate-all-around structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Referring to FIG. 1, according to some aspects, for device regions that have a narrow distance between nFET and pFET devices (i.e., the n/p distance), such as Static Random-Access Memory (SRAM) and dense logic regions, a patterning boundary can be extended to open FETs, and for other device regions having larger n/p distances, the patterning boundary can be extended toward the open FETs (e.g., into a region of the open FET—the nFET region—by about 1-10 nm), and up to the open FETs.

According to some embodiments, a Replacement Metal Gate (RMG) method 100 of forming a nanosheet structure includes providing a base device at step 101, the base device comprising a base layer structure, which can include, for example, a substrate, an isolator, a high-K (HK) dielectric layer. According to some embodiments, the base device further comprises one or more bottom gate materials, and a plurality of nanosheet stacks comprising a plurality of nanosheet channels having a width between about 15-50 nm (and up to about 80 nm) and a length between source/drain regions of about 12 nm, surrounded by successive layers of an interfacial material and a high-K material, and a first work function material separating the nanosheet channels from one another. According to at least one embodiment, a distance between the nanosheets (Tsus) is about 6-11 nm. According to some embodiments, the nanosheet structures include a plurality of stacked nanosheets, configured to function as channels, are surrounded by a work function metal. According to at least one embodiment, the stacked nanosheets are formed in a first region (e.g., a logic region) comprising nFET and pFET regions with wide n/p distances (e.g., about 70 nm), and a second region (e.g., a SRAM or dense logic region) comprising densely packed second nFET and pFET regions with narrow n/p distances (e.g., about 35 nm).

According to some embodiments, an organic planarizing layer (OPL) is deposited at step 102, the organic planarizing layer is patterned at step 103 to expose a portion of the work function metal between the nFET and pFET in the first region, and a portion of a top of the nFET stack in the second region.

Figure 5:
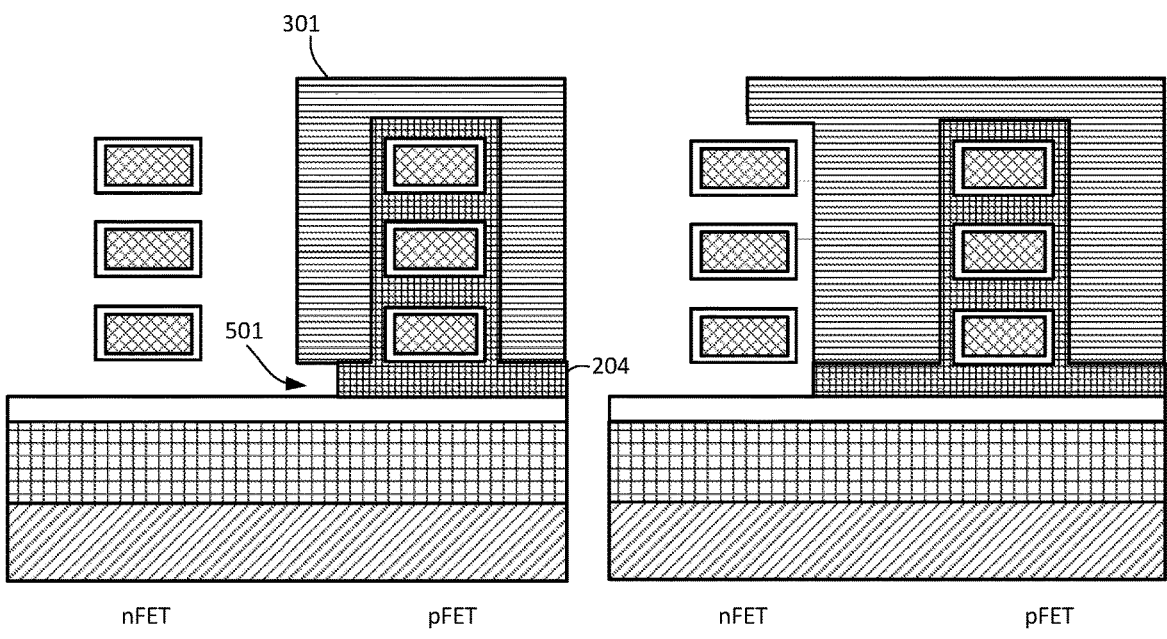
Figure 10:
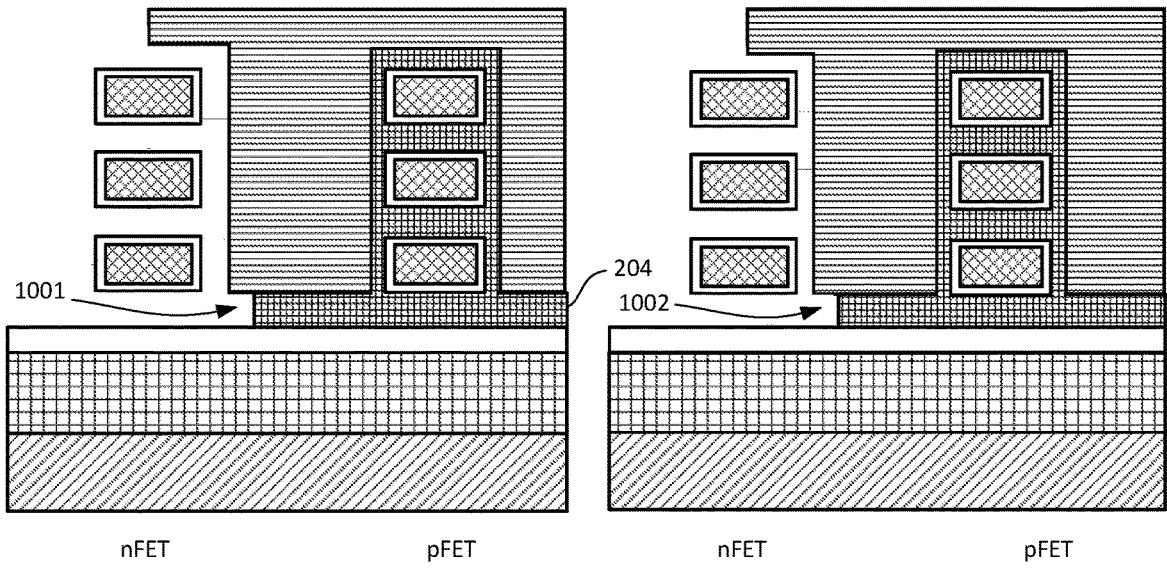
Figure 18:
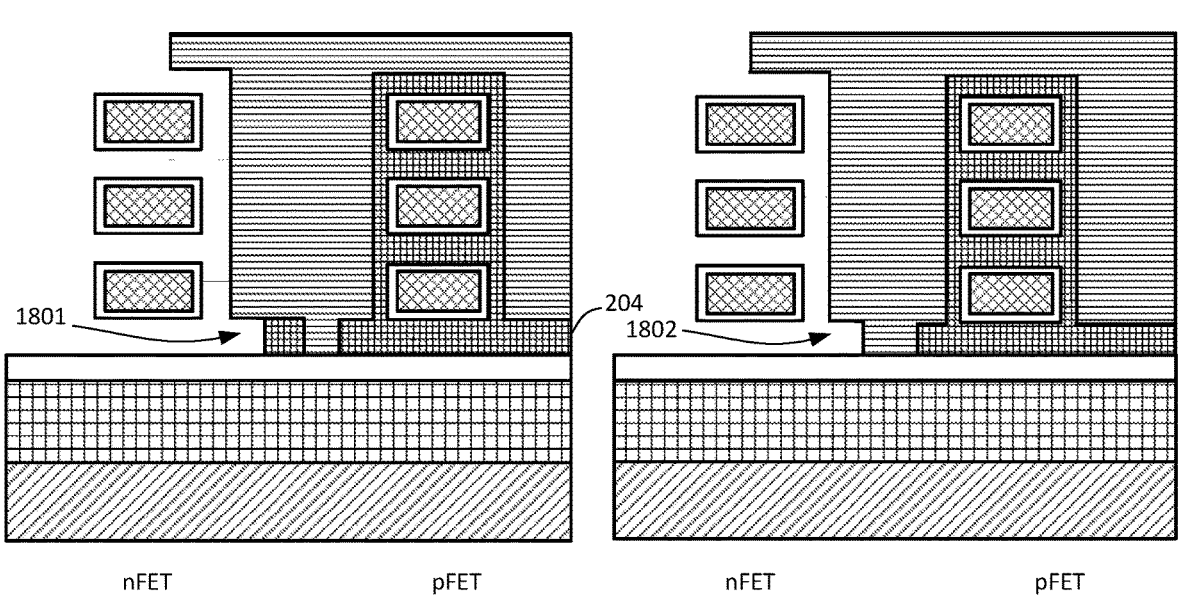

According to some embodiments, a portion of the work function material in the nFET regions of the first and the second region are removed, e.g., by wet or dry etch, at step 104 (e.g., see FIG. 5, FIG. 10, FIG. 18). According to at least one embodiments, the bottom gate is undercut (below the organic planarizing layer) in the first region at step 104 (e.g., see FIG. 5, FIG. 18). According to at least one embodiments, the bottom gate is undercut (below the organic planarizing layer) in the first and second regions at step 104 (e.g., see FIG. 10). According to some embodiments, the remainder of the organic planarizing layer is removed at step 105 (e.g., see FIG. 6, FIG. 11, FIG. 19). It should be understood that end portions (not shown) of the channels are supported by, for example, spacers that isolate gate material from source/drain structures.

Figure 7:
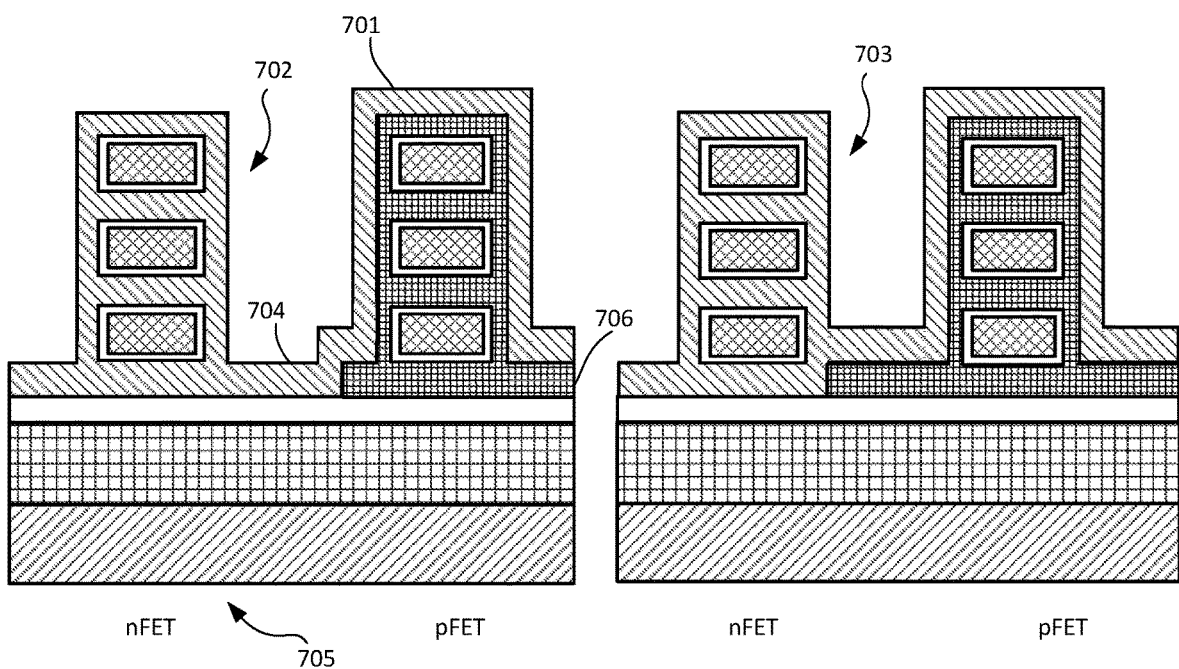
Figure 12:
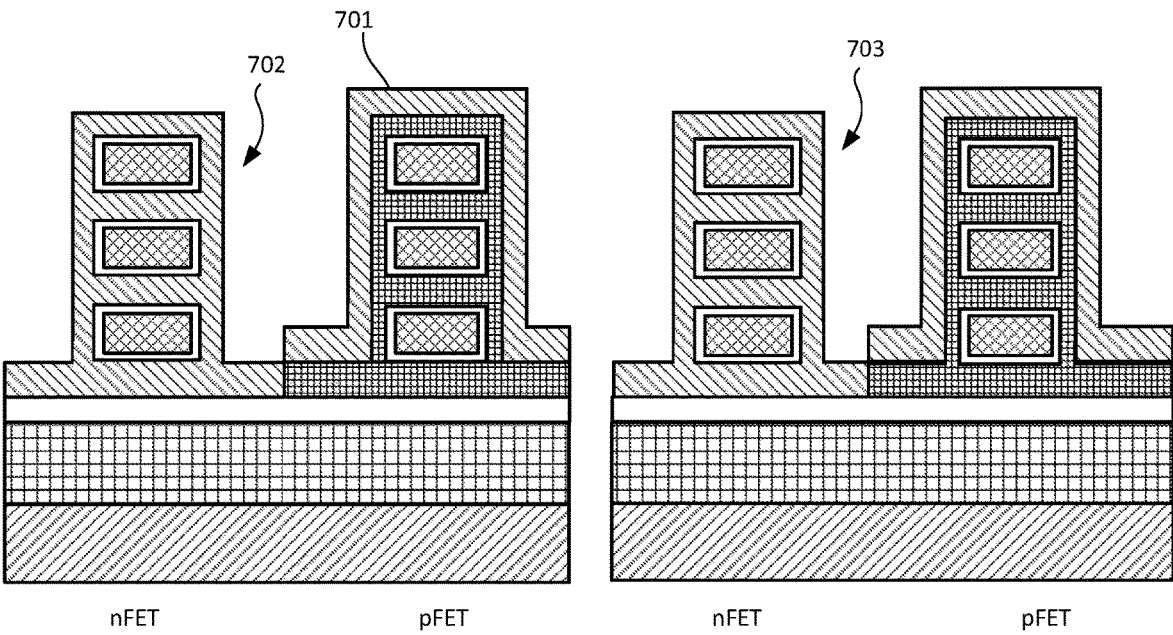
Figure 20:
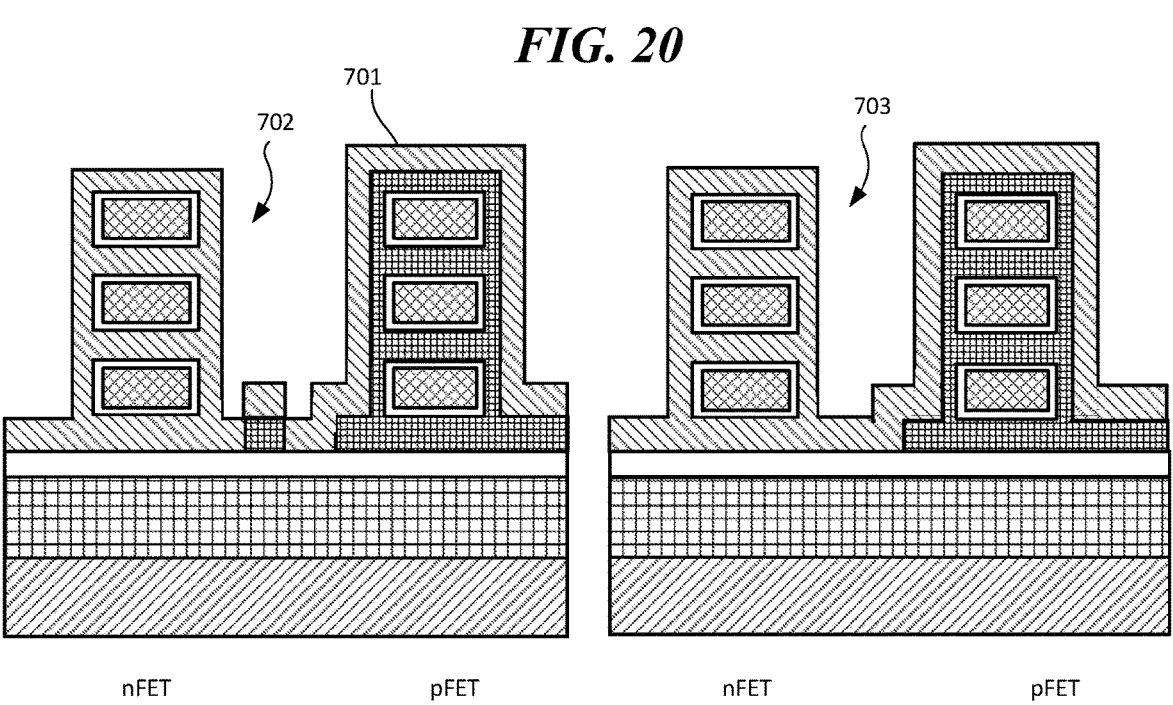

According to some embodiments, a second work function material (or gate metal) is deposited over the device forming a gate-all-round (GAA) in the nFET regions of the first and second region (e.g., the open FETs) at step 106 (e.g., see FIG. 7, FIG. 12, FIG. 20). According at least one embodiment, an interlevel dielectric (ILD) cap is formed over the device at step 107 (e.g., see FIG. 8, FIG. 13, FIG. 21).

According to at least one embodiment, the first work function metal forms a gate-all-around structure for the pFETs, and can be, for example, a metal nitride such as titanium nitride (TIN). According to at least one embodiment, the second work function material forms a gate-all-around structure for the nFETs. According to some embodiments, the second work function material can include one or more layers. In an example embodiment of a single layer second work function material, the material can include aluminum (Al), titanium (Ti), and titanium aluminide (TiAl), titanium aluminum carbide (TiAlC), or an Al containing metal or a Ti containing metal, etc. In an example embodiment of a multi-layer second work function material, a two-layer structure can comprise a first layer of a metal nitride and a second layer of an Al containing metal or a Ti containing metal. In an example embodiment of a multi-layer second work function material, a tri-layer structure can include a first layer of a metal nitride, a second layer of an Al containing metal or Ti containing metal, and a third layer of a metal nitride. These and other materials are contemplated.

Figure 14:
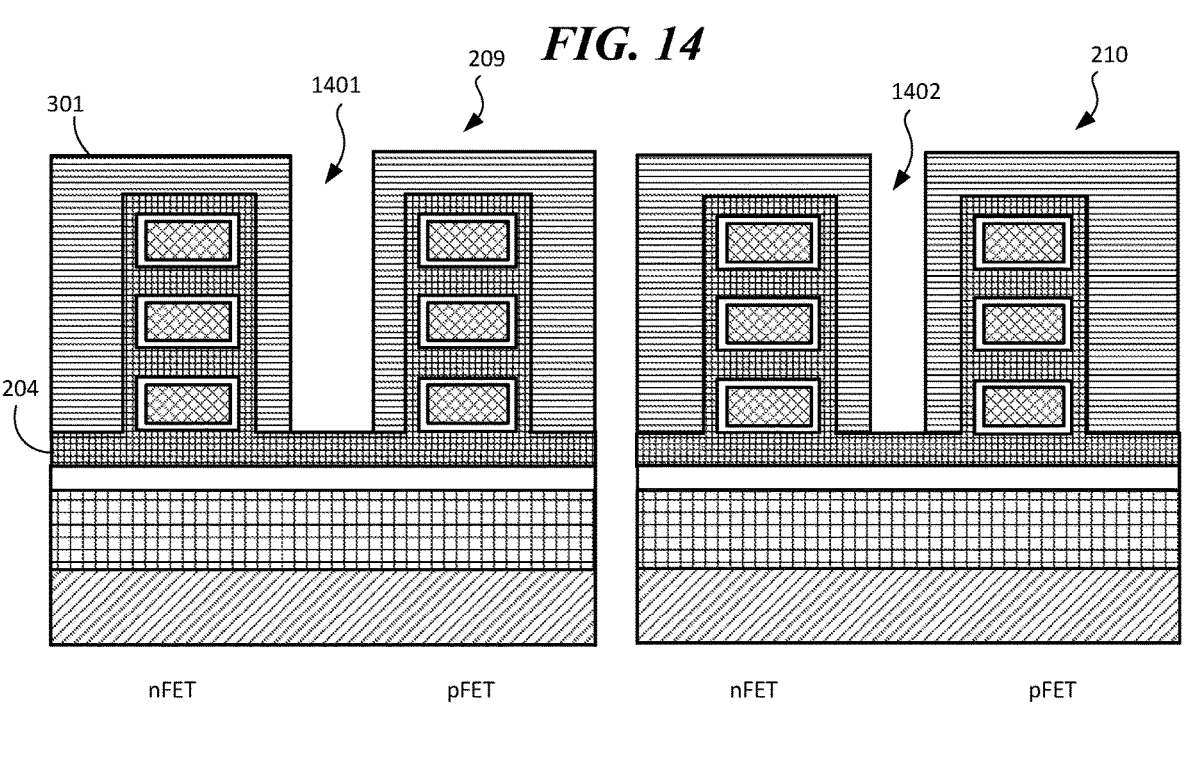
FIGS. 14-21 are cross-section views of a nanosheet structure at different steps in a manufacturing process according to one or more embodiments of the present invention.

According to some embodiments and referring again to FIG. 1, following the deposition of the organic planarizing layer (OPL) is deposited at step 102, the organic planarizing layer is patterned to form a first organic planarizing layer cut and a second organic planarizing layer cut in the first and second regions at step 108 (e.g., see FIG. 14). According to some embodiments, the bottom gate is patterned to form a first metal gate cut and a second metal gate cut in the first and second regions, which exposes the high-k dielectric layer at step 109 (e.g., see FIG. 15). According to some embodiments, the first metal gate cut and the second metal gate cut in the organic planarizing layer are filled with an organic material at step 110 (e.g., see FIG. 16), before patterning the organic planarizing layer at step 103.

FIGS. 2-8 are cross-section views of a nanosheet device at different steps in a manufacturing process according to one or more embodiments of the present invention.

Figures 2, 3:
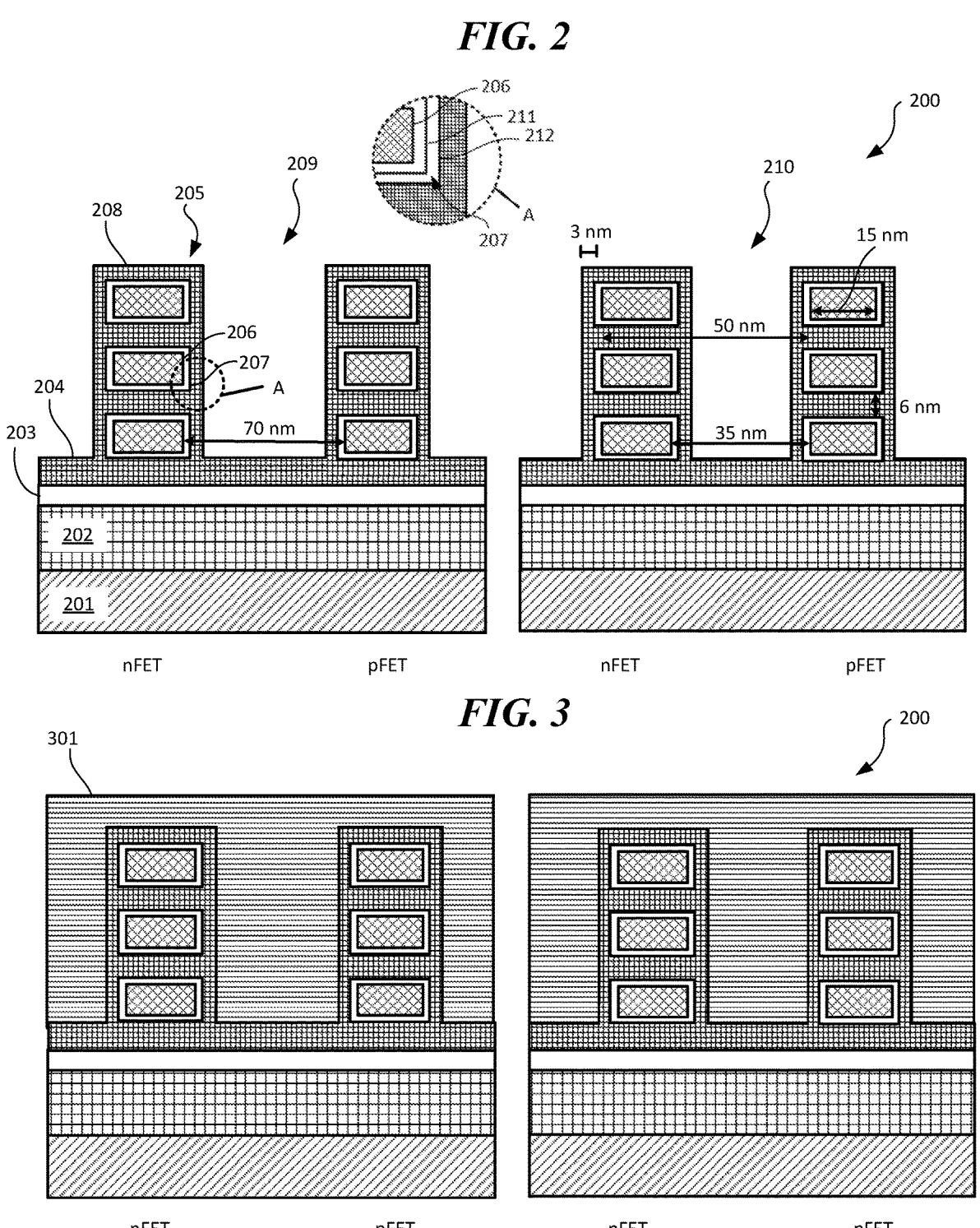
FIGS. 2-8 are cross-section views of a nanosheet structure at different steps in a manufacturing process according to one or more embodiments of the present invention.

According to some embodiments and as illustrated in FIG. 2, an initial structure of a device 200 is provided including a substrate 201, an isolator 202, a high-K dielectric layer 203 (HK), and a bottom gate material 204. The base device further comprises a nanosheet stack 205 comprising a plurality of nanosheet channels 206, surrounded by one or more additional encapsulating layers 207 (e.g., successive layers of an interfacial layer 211 and a high-K material 212—see view A in FIG. 2), and a first work function material 208 separating the nanosheet channels from one another. According to some embodiments, the nanosheet channels 206 are configured to function as channels, are surrounded by a work function metal. According to at least one embodiment, the nanosheet stacks are formed in a first region 209 (e.g., a logic region) comprising nFET and pFET regions, and a second region 210 (e.g., a SRAM or dense logic region) comprising densely packed second nFET and pFET regions with narrow n/p distances.

According to some embodiments, the interfacial layer 211 (e.g., silicon dioxide ($SiO_2$) or silicon oxynitride (SiON)) has better gate dielectric quality than a high-K dielectric when it is connected to a Si substrate. According to at least one embodiment, the interfacial layer 211 improves device mobility to improve the device performance and device reliability. According to some aspects, the interfacial layer 211 is low-K dielectric, and the high-K material 212 reduces the gate leakage and improve capacitances.

According to some embodiments, the high-K material 212 is a dielectric and part of a gate dielectric, which improves capacitance without gate leakage degradation. Examples of high-K dielectrics include, but are not necessarily limited to, HfO2 (hafnium oxide), ZrO2 (zirconium dioxide), hafnium zirconium oxide (HfZrO), Al2O3 (aluminum oxide), and Ta2O5 (tantalum oxide). Other examples of high-K dielectrics include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

According to at least one embodiments, the n/p distance in the second region 210 (e.g., the dense logic regions) is about 35 nm, and the n/p distance in the first region 209 (e.g., logic region) is about 1.2 to 2 times larger than that of the second region. According to some embodiments, the pitch of the nanosheet channels in the second region 210 is about 50 nm. It should be understood that the example dimensions are non-limiting, and that other dimensions are contemplated.

According to some embodiments, the nanosheet channels 206 have a width of about 15 nm, the distance between channels (Tsus) is about 6 nm, and a thickness of the work function material forming sidewalls of the nanosheet stacks is about 3 nm. It should be understood that the example dimensions are non-limiting, and that other dimensions are contemplated.

Figure 4:
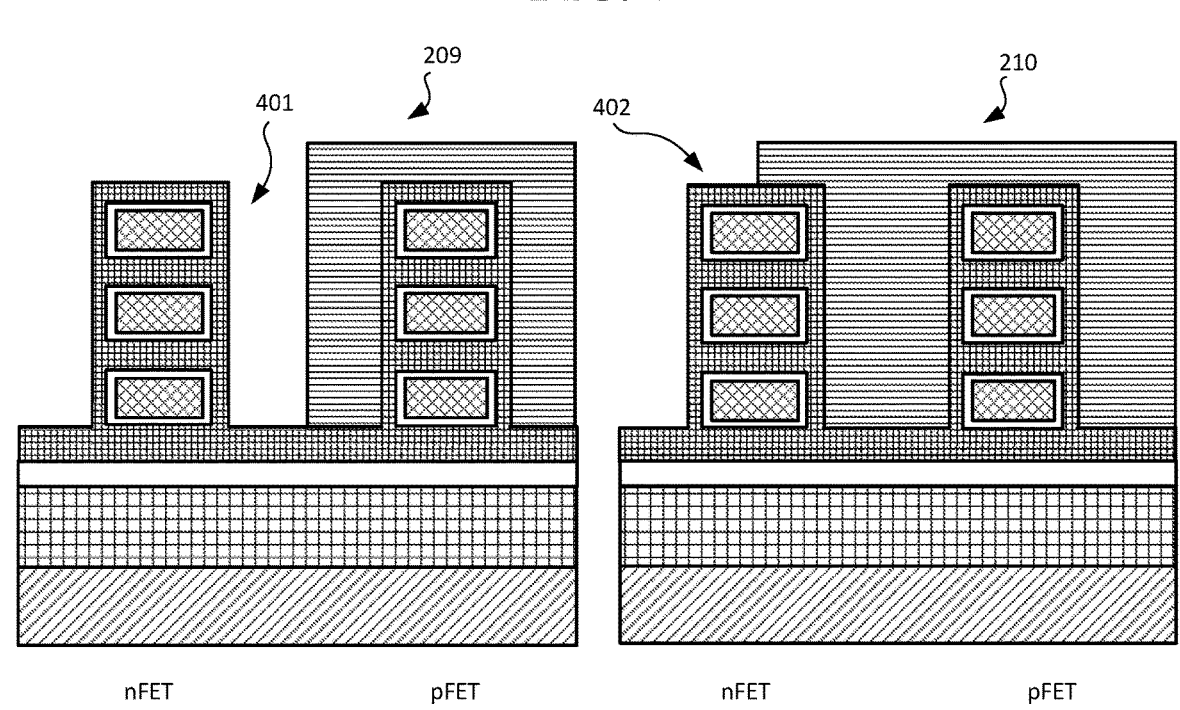

According to some embodiments and as illustrated in FIG. 3, an organic planarizing layer 301 is deposited over the device 200, and as illustrated in FIG. 4, the organic planarizing layer is patterned to expose a first region portion 401 of the work function metal between the nFET and pFET in the first region 209, and a second region portion 402 of a top of the nFET stack in the second region 210.

Figure 6:
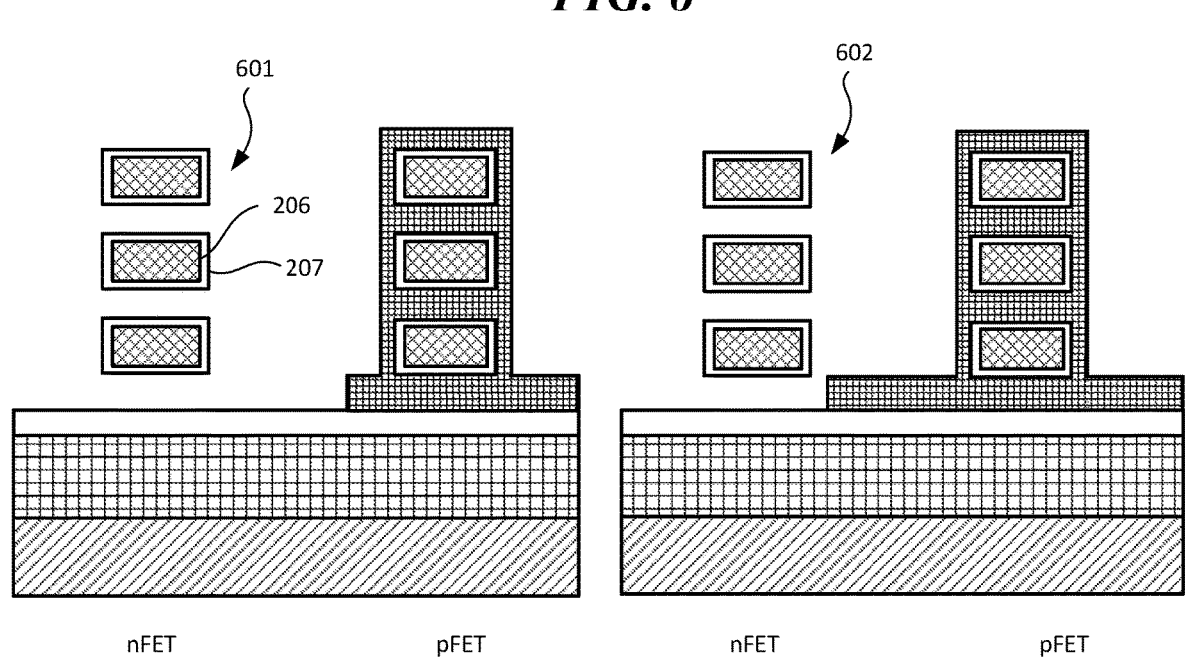

According to some embodiments and as illustrated in FIG. 5, a portion of the work function material in the nFET regions of the first and the second region are removed, e.g., by wet or dry etch. According to at least one embodiments, the bottom gate material 204 is undercut (below the OPL) in the first region forming a first undercut area 501. According to some embodiments and as illustrated in FIG. 6, the remainder of the OPL (not shown) is removed. It should be understood that end portions (not shown) of the nanosheet channels 206, the encapsulating layers 207 are supported by, for example, spacers (not shown) that isolate gate material from source/drain structures (not shown).

According to some embodiments and as illustrated in FIG. 7, a second gate metal 701 is deposited over the device, including forming a gate-all-round (GAA) structures 702 and 703 in the nFET regions of the first and second region (e.g., the open FETs 601, 602 illustrated in FIG. 6), respectively.

As show in FIG. 7, the device includes a first bottom gate material 704 disposed directly on the base layer structure 705 in the nFET regions and a second bottom gate material 706 disposed directly on the base layer structure in the pFET regions.

Figure 8:
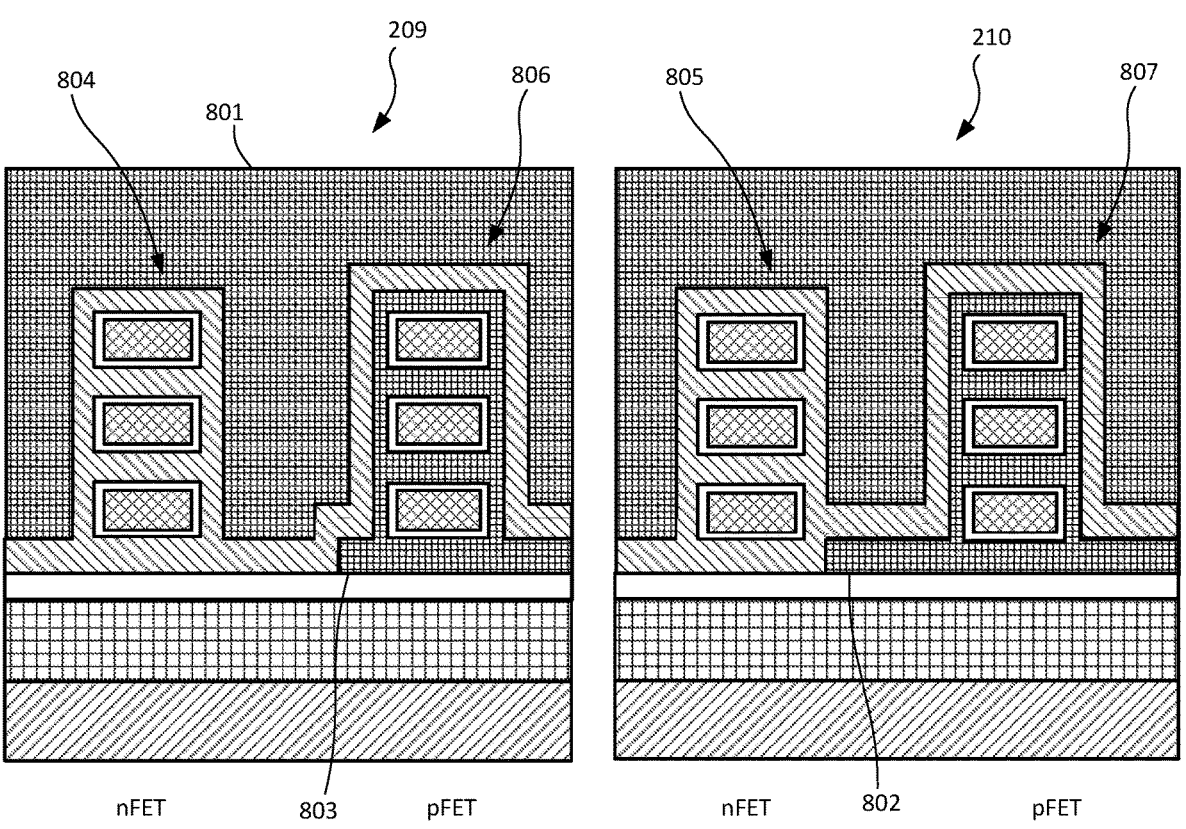

According to some embodiments and as illustrated in FIG. 8, an interlevel dielectric cap 801 is formed over the device.

Referring to FIG. 8, according to some aspects, for the second region 210 (e.g., a SRAM or dense logic region) that has a narrow n/p distance, a second patterning boundary embodied by a second end portion 802 of the bottom gate, also called the metal gate boundary, is extended to the open FET (e.g., the nFET in the second region), up to the open FETs, and for the first region 209 having larger n/p distances, a first patterning boundary embodied by a first end portion 803 can be extended towards the open FETs. According to one or more embodiments of the present invention, the second patterning boundary embodied by the second end portion 802 of the bottom gate in the second region (e.g., the narrow n/p space device) is close to the open FETs (i.e., beyond a middle distance of the narrow n/p space).

According to some embodiments and as illustrated in FIG. 8, in both the first region 209 and the second region 210, a first plurality of nanosheet gate-all-round device structures 804, 805 are formed on the first bottom gate material and a second plurality of nanosheet gate-all-round device structures 806, 807 on the second bottom gate material.

FIGS. 9-13 are cross-section views of a nanosheet device at different steps in a manufacturing process according to one or more embodiments of the present invention. According to some embodiments, a patterning boundaries are extended toward the open FETs for both narrow n/p distance regions/devices and wide n/p distance regions/devices (see FIG. 13). According to one or more embodiments of the present invention, the patterning boundary in the narrow n/p distance region is closer to the open FETs than the patterning boundary in the wide n/p distance region.

Figure 9:
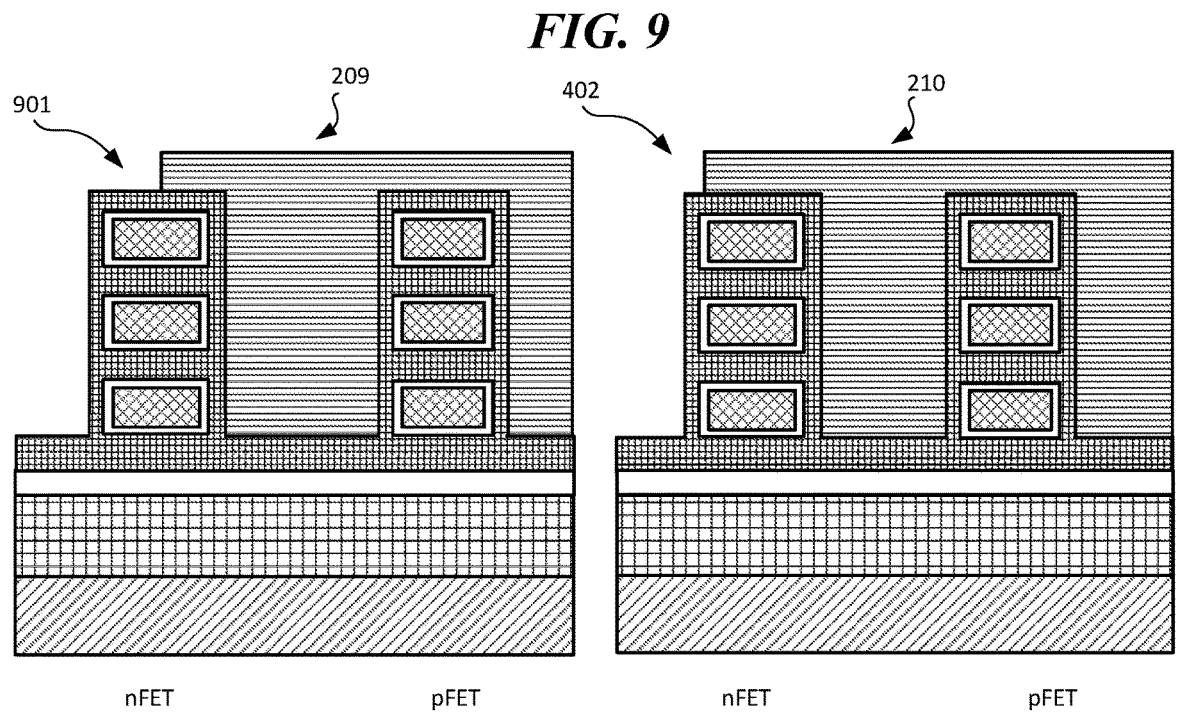
FIGS. 9-13 are cross-section views of a nanosheet structure at different steps in a manufacturing process according to one or more embodiments of the present invention.

According to some embodiments, the cross-section views shown in FIG. 2 and FIG. 3 are precursors to the cross-section view illustrated in FIG. 9. According to some embodiments and as illustrated in FIG. 9, the organic planarizing layer is patterned to expose a first region portion 901 of a top of the nFET stack in the first region 209, and a second region portion 402 of a top of the nFET stack in the second region 210.

Figure 11:
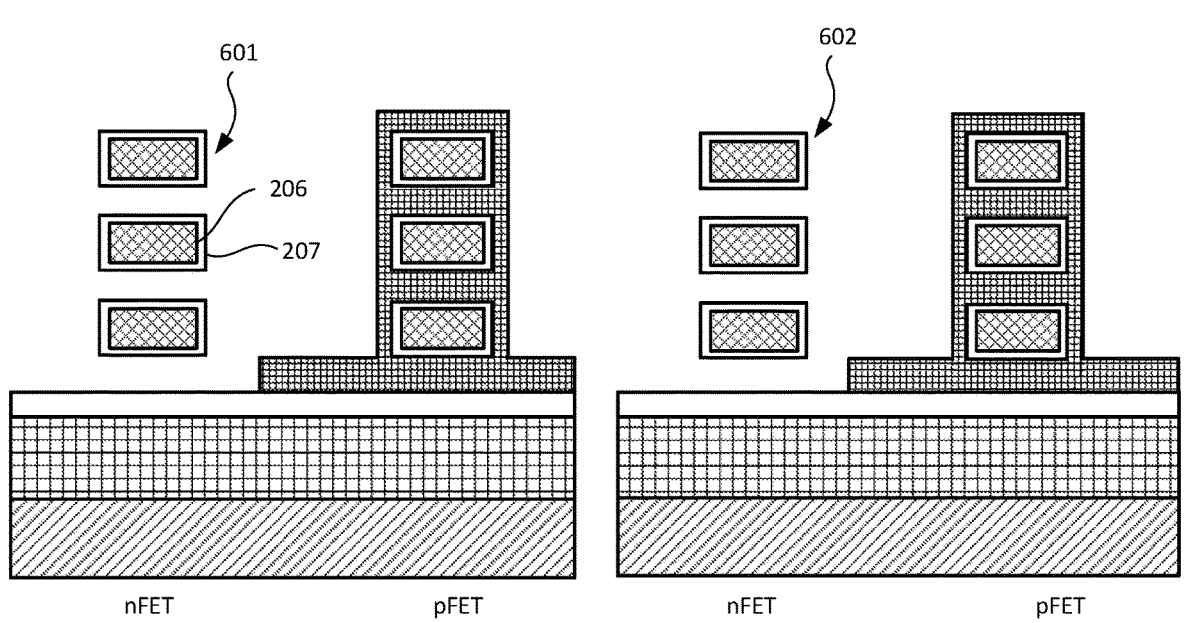

According to some embodiments and as illustrated in FIG. 10, a portion of the work function material in the nFET regions of the first and the second region are removed, e.g., by wet or dry etch. According to at least one embodiments, the bottom gate material 204 is undercut (below the organic planarizing layer) in the first region and the second region forming a second undercut area 1001 and third undercut area 1002. According to some embodiments and as illustrated in FIG. 11, the remainder of the organic planarizing layer (not shown) is removed. It should be understood that end portions (not shown) of the nanosheet channels 206, the encapsulating layers 207 are supported by, for example, spacers (not shown) that isolate gate material from source/drain structures (not shown).

According to some embodiments and as illustrated in FIG. 12, a second gate metal 701 is deposited over the device, including forming a gate-all-round (GAA) structures 702 and 703 in the nFET regions of the first and second region (e.g., the open FETs 601, 602 illustrated in FIG. 11), respectively. According to some embodiments and as illustrated in FIG. 13, an interlevel dielectric cap 801 is formed over the device.

Figure 13:
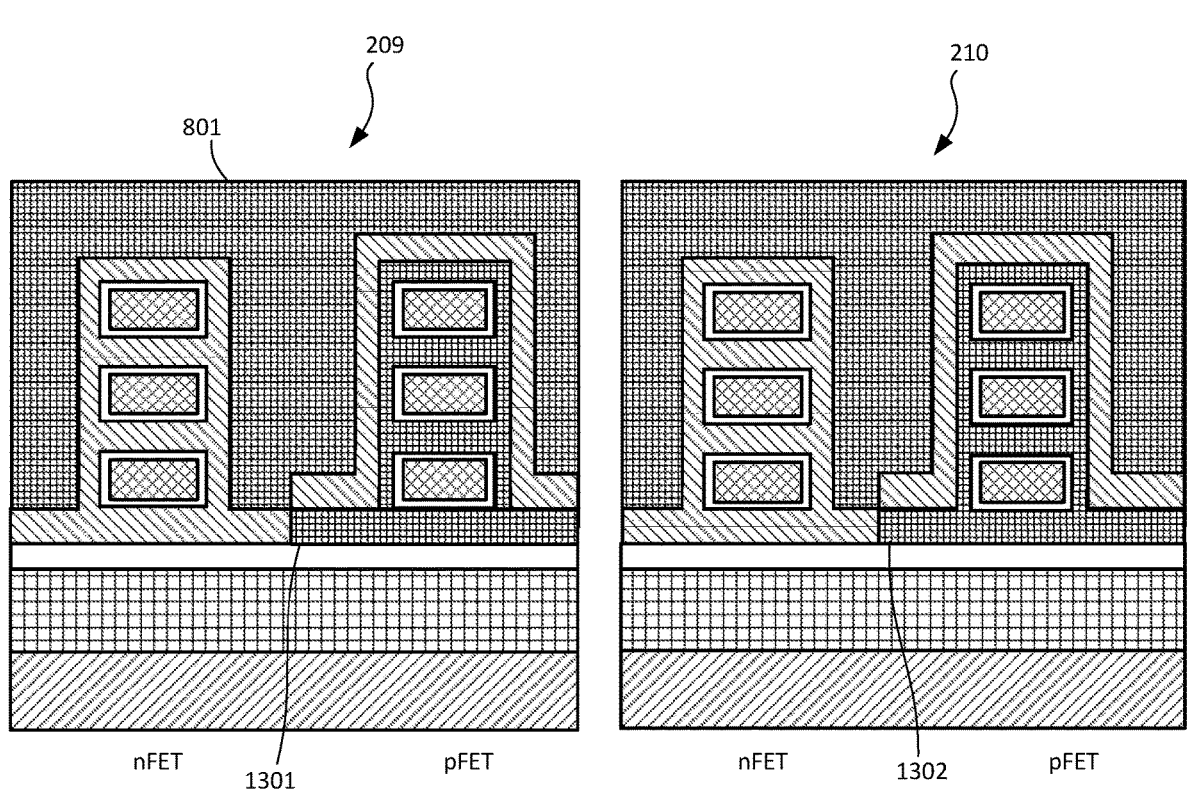

Referring to FIG. 13, according to some aspects, a third patterning boundary 1301 and a fourth patterning boundary 1302 in the first and second regions 209, 210 are extended to the open FETs (e.g., the nFETs 601, 602). According to one or more embodiments of the present invention, the third patterning boundary 1301 and the fourth patterning boundary 1302 have a same length (e.g., measured from the channels of the pFETs).

FIGS. 14-21 are cross-section views of a nanosheet device at different steps in a manufacturing process according to one or more embodiments of the present invention. According to some embodiments, a metal gate cut in a shared gate region is patterned (see FIG. 14) before RMG patterning (see FIGS. 17-19).

Figure 15:
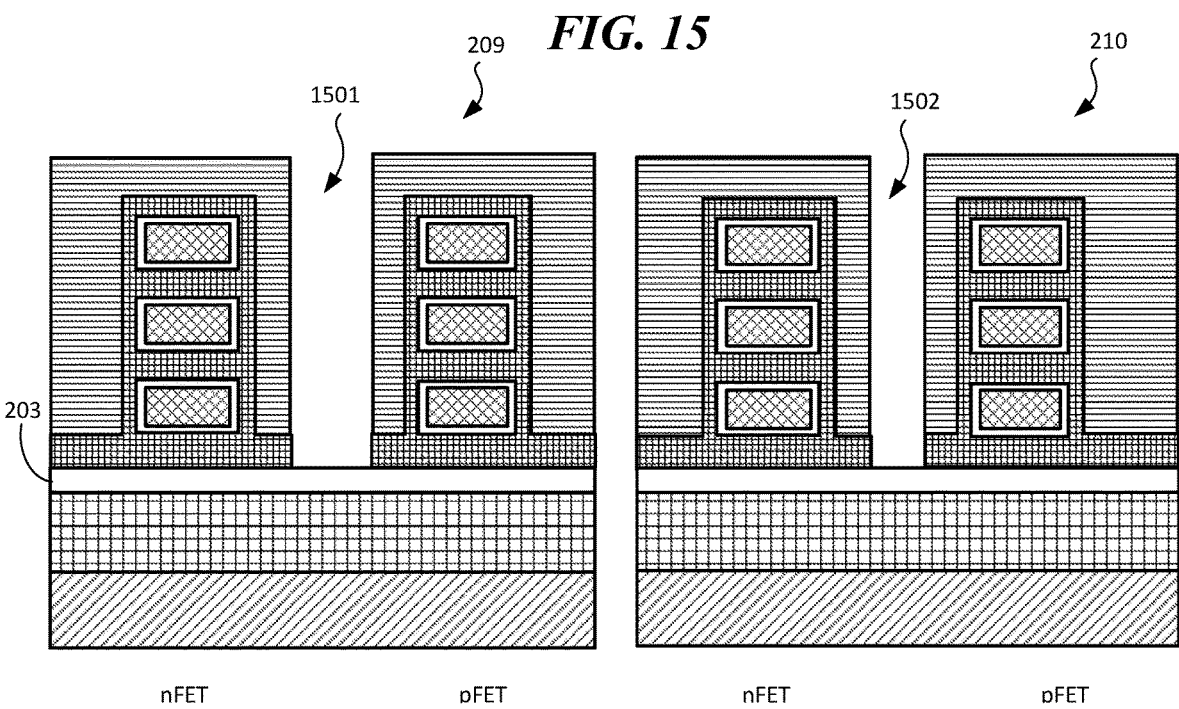
Figure 16:
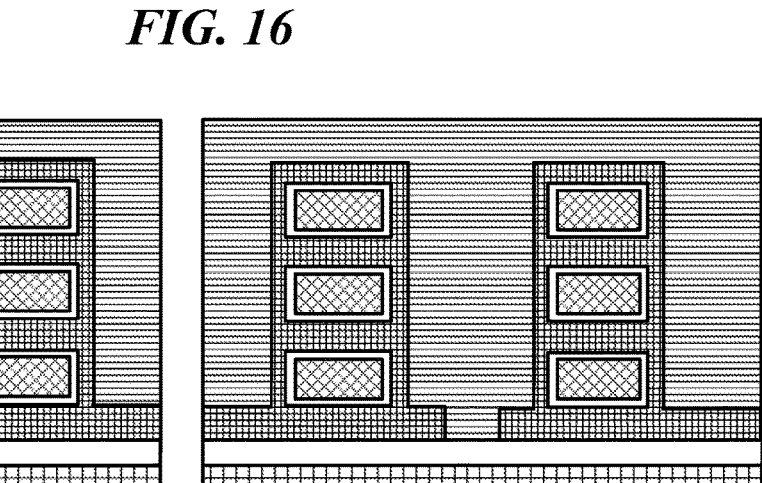

According to some embodiments, the cross-section views shown in FIG. 2 and FIG. 3 are precursors to the cross-section view illustrated in FIG. 14. According to some embodiments and as illustrated in FIG. 14, the organic planarizing layer 301 is patterned to form a first organic planarizing layer cut 1401 and a second organic planarizing layer cut 1402 in the first region 209 and the second region 210. According to some embodiments and as illustrated in FIG. 15, the bottom gate material 204 is patterned to form a first metal gate cut 1501 and a second metal gate cut 1502 in the first region 209 and the second region 210, which exposes the high-K dielectric layer 203. According to some embodiments and as illustrated in FIG. 16, the first metal gate cut and the second metal gate cut in the organic planarizing layer 301 are filled with an organic material.

Figure 17:
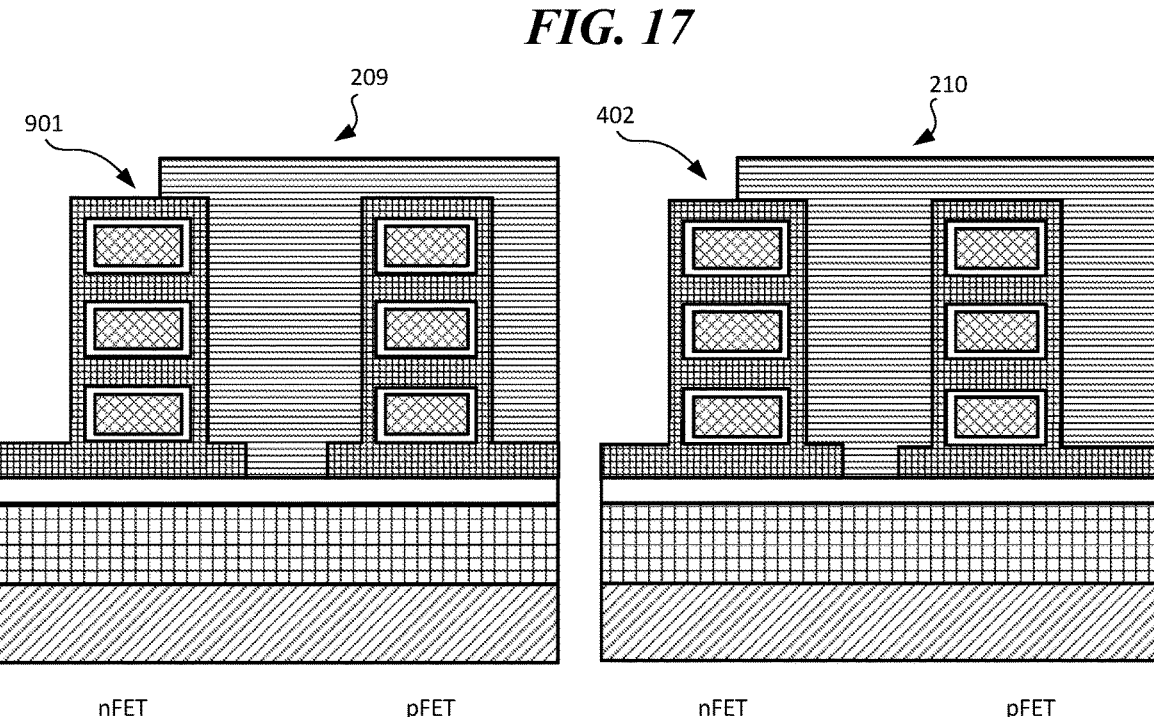

According to some embodiments and as illustrated in FIG. 17, the organic planarizing layer is patterned to expose a first region portion 901 of a top of the nFET stack in the first region 209, and a second region portion 402 of a top of the nFET stack in the second region 210.

Figure 19:
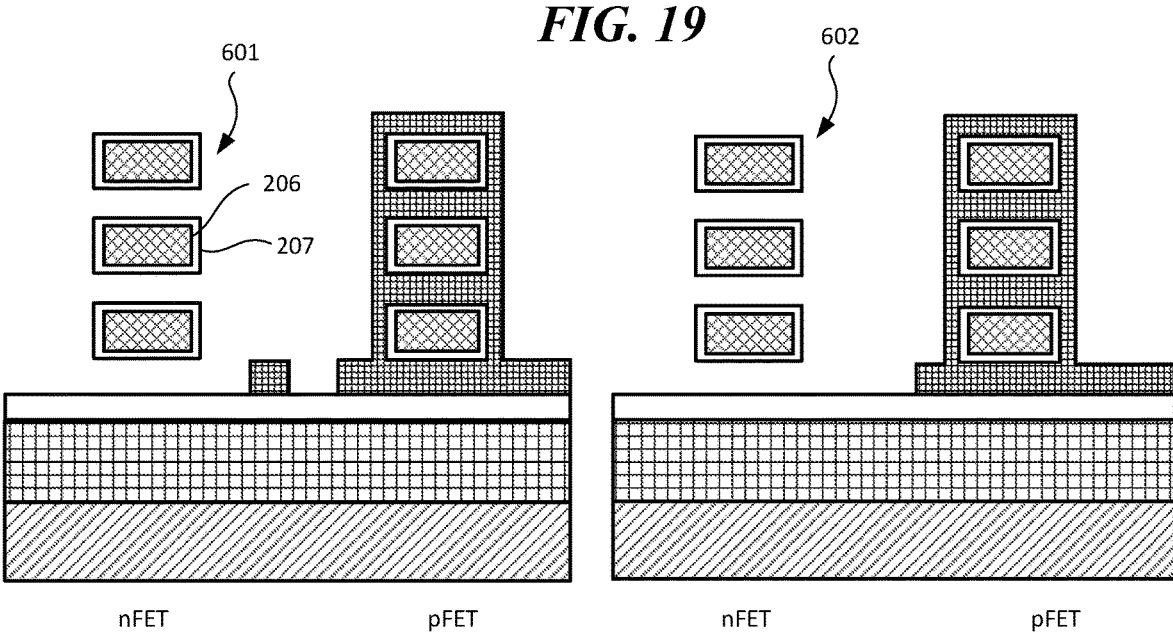

According to some embodiments and as illustrated in FIG. 18, a portion of the work function material in the nFET regions of the first and the second region are removed, e.g., by wet or dry etch. According to at least one embodiments, the bottom gate material 204 is undercut (below the organic planarizing layer) in the first region and the second region forming a fourth undercut area 1801 and fifth undercut area 1802. According to some embodiments and as illustrated in FIG. 19, the remainder of the organic planarizing layer (not shown) is removed. It should be understood that end portions (not shown) of the nanosheet channels 206, the encapsulating layers 207 are supported by, for example, spacers (not shown) that isolate gate material from source/drain structures (not shown).

According to some embodiments and as illustrated in FIG. 20, a second gate metal 701 is deposited over the device, including forming a gate-all-round (GAA) structures 702 and 703 in the nFET regions of the first and second region (e.g., the open FETs—the nFETs 601-602 illustrated in FIG. 19), respectively. According to some embodiments and as illustrated in FIG. 21, an interlevel dielectric cap 801 is formed over the device.

Figure 21:
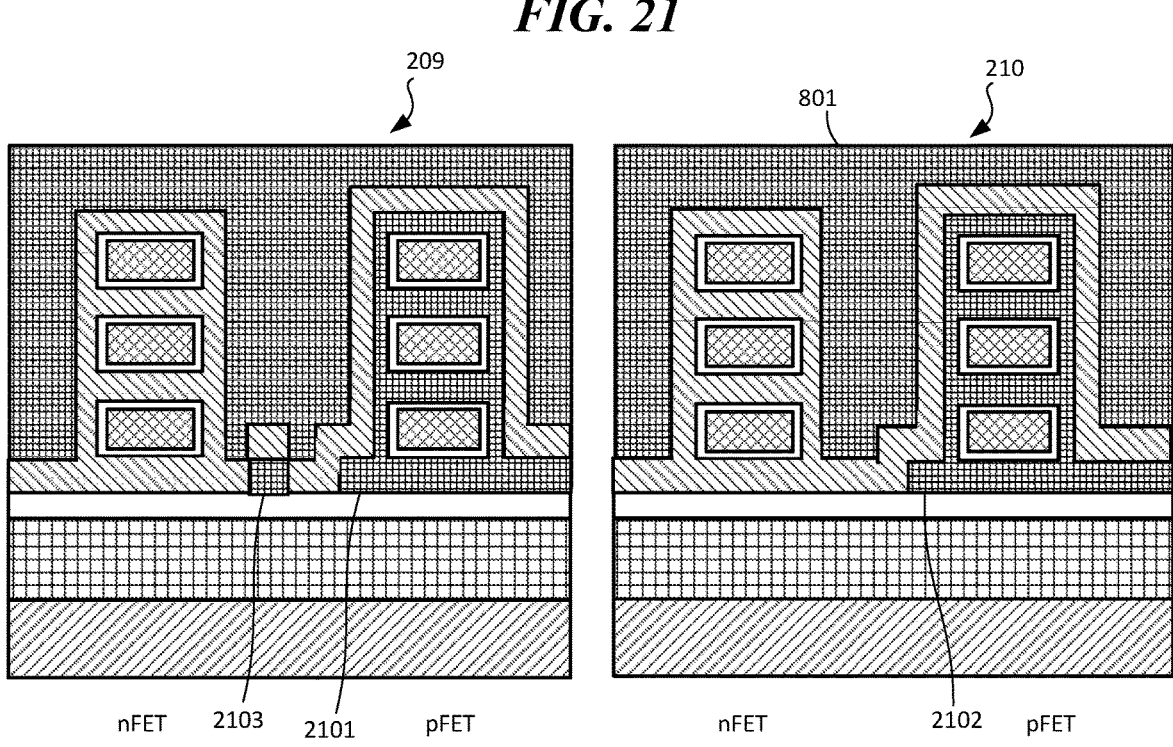

Referring to FIG. 21, according to some aspects, a fifth patterning boundary 2101 and a sixth patterning boundary 2102 in the first region 209 and the second region 210 are extended to the open FETs (e.g., the nFETs 601, 602). According to one or more embodiments of the present invention, the third patterning boundary 1301 and the fourth patterning boundary 1302 have a same length (e.g., measured from the channels of the pFETs). According to one or more embodiments of the present invention, there is a residual island 2103 formed of pFET metal in the n/p boundary region, which is close to the open FET (i.e., the nFET in the first region 209).

Figure 22:
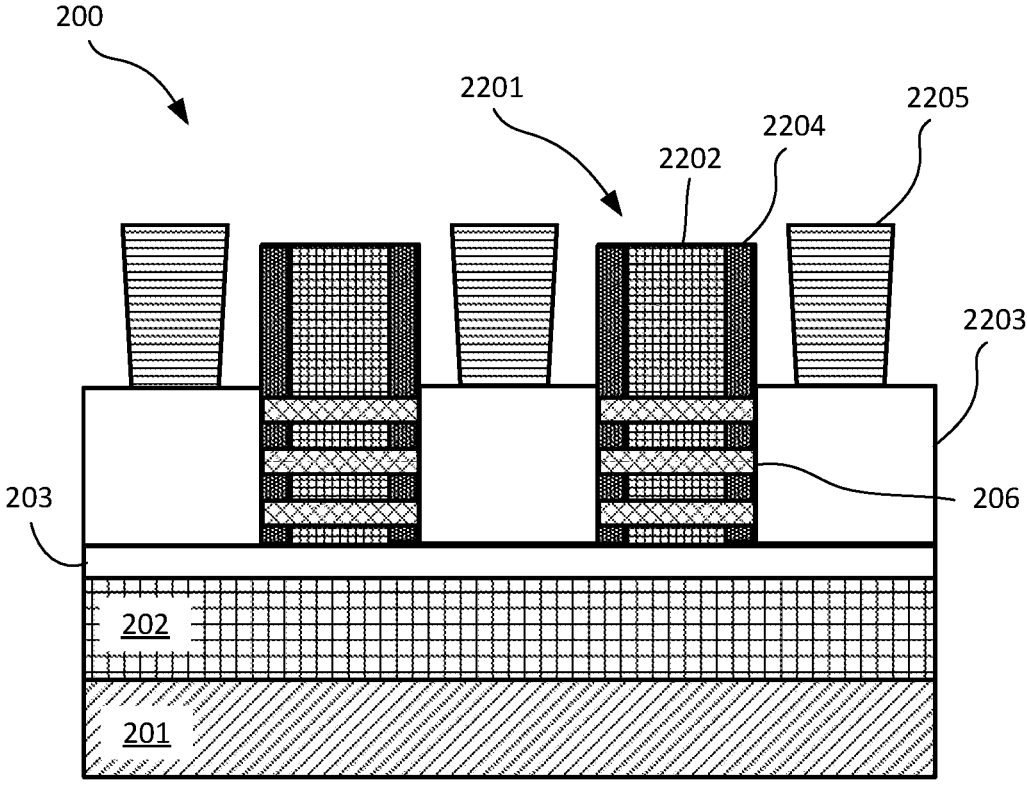
FIG. 22 is a cross-section via of the device of FIG. 2 and perpendicular to the view of FIGS. 2-21.

According to some embodiments and referring to FIG. 22, a cross section of the device 200 perpendicular to the views shown in FIG. 3-21 and across a gate 2201. According to example embodiments, the gate 2201 includes the high-K dielectric material 2202 configured as a gate electrode, the work function metal of the nanosheet channels 206 between the source/drain regions 2203, and spacers 2204. According to at least one embodiment, the source/drain regions 2203 are connected to both sides of the nanosheet channels 206. According to example embodiments, a contact 2205 is formed on each S/D structure. According to some embodiments, the spacers 2204 isolate the high-K dielectric material 2202 from the source/drain regions 2203.

Recapitulation:

According to embodiments of the present invention, a device includes a base layer structure (201-203) comprising a first region (209) and a second region (210); a first bottom gate material (704) directly on the base layer structure in a plurality of first-type doped regions (nFET) in the first region and the second region; a second bottom gate material (706) directed on the base layer structure in a plurality of second-type doped regions (pFET) in the first region and the second region; a first plurality of nanosheet gate-all-round device (804-805) structures on the first bottom gate material; and a second plurality of nanosheet gate-all-round device structures (806-807) on the second bottom gate material, wherein the first bottom gate material is located over the second plurality of nanosheet gate-all-around device structures in the plurality of second-type doped regions of the first region and the second region, wherein the second bottom gate material extends, in boundary regions between the plurality of first-type doped regions and the plurality of second-type doped regions, on the base layer structure from the second plurality of nanosheet gate-all-around devices structures toward the first plurality of nanosheet gate-all-round device structures.

According to some embodiments, a method of manufacturing a device includes providing a base device (at step 101) comprising a first region and a second region, a base layer structure, a bottom gate material on the base layer structure, and a first plurality of nanosheet stacks in a first-type doped region in the first region and a second-type doped region in the first region and a second plurality of nanosheet stacks the first-type doped region in the second region and the second-type doped region in the second region, each of the first and second nanosheet stacks comprising a plurality of nanosheet channels surrounded by a first work function metal; depositing an organic planarizing layer (at step 102); patterning the organic planarizing layer (at step 103) to expose the first plurality of nanosheet stacks in the first-type doped region in the first region and a portion of the first plurality of nanosheet stacks in the first-type doped region in the second region; removing the bottom gate material and a portion of the work function material (at step 104) in the first-type doped regions of the first region and the second region, including forming a first undercut region below the organic planarizing layer in the first region; removing the organic planarizing layer (at step 105); deposing a second work function material (at step 106) over the device forming a gate-all-round (GAA) in the first-type doped regions of the first region and the second region; and depositing an interlevel dielectric cap over the device (at step 107).

According to some embodiments, the method further includes, following the depositing of the organic planarizing layer, patterning the organic planarizing layer (at step 108) to form a first organic planarizing layer cut and a second organic planarizing layer cut in the first region and the second region; patterning the bottom gate material (at step 109) to form a first metal gate cut and a second metal gate cut in the first and second regions exposing the base layer structure; and filling the first metal gate cut and the second metal gate cut in the organic planarizing layer with an organic material (at step 110).

The terminology used herein is for the purpose of describing particular embodiments only and is not intended to be limiting of the invention. As used herein, the singular forms "a," "an" and "the" are intended to include the plural forms as well, unless the context clearly indicates other-wise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
a base layer structure comprising a first region and a second region;
a first bottom gate material disposed directly on the base layer structure in a plurality of first-type doped regions in the first region and the second region;
a second bottom gate material disposed directly on the base layer structure in a plurality of second-type doped regions in the first region and the second region;

a first plurality of nanosheet gate-all-round device structures on the first bottom gate material; and a second plurality of nanosheet gate-all-round device structures on the second bottom gate material, wherein the first bottom gate material is located over the second plurality of nanosheet gate-all-around device structures in the plurality of second-type doped regions of the first region and the second region, wherein the second bottom gate material extends, in boundary regions between the plurality of first-type doped regions and the plurality of second-type doped regions, on the base layer structure from the second plurality of nanosheet gate-all-around devices structures toward the first plurality of nanosheet gate-all-round device structures, wherein the second bottom gate material extends a first distance in the first region and a second distance in the second region, and wherein the first distance is less than the second distance.

2. The device of claim 1, wherein the base layer structure comprises:

a substrate;

an insulator on the substrate; and a high-K dielectric layer on the insulator.

3. The device of claim 1, wherein the second bottom gate material extends, in the second region, to the first plurality of nanosheet gate-all-round device structures in an adjacent one of the plurality of first-type doped regions.

4. The device of claim 1, wherein the second bottom gate material extends a first distance in the first region and a second distance in the second region, wherein the first distance and the second distance are equal.

5. The device of claim 4, wherein the first distance and the second distance are at least half a distance between adjacent ones of the first plurality of nanosheet gate-all-round device structures and the second plurality of nanosheet gate-all-round device structures.

6. The device of claim 1, wherein the second bottom gate material extends a first distance in the first region and a second distance in the second region, wherein the device further comprises a residual island of the second bottom gate material in the boundary region.

7. The device of claim 6, wherein the residual island of the second bottom gate material in the boundary region is nearer to the first-type doped region of the first region.

8. The device of claim 1, wherein the boundary region in the first region is wider than the boundary region in the second region.

9. The device of claim 1, wherein the first plurality of nanosheet gate-all-round device structures and the second plurality of nanosheet gate-all-round device structures each comprise:

a plurality of channels disposed in a stack and separated by a work function material;

an interfacial layer encapsulating the plurality of channels; and a high-K material encapsulating the interfacial layer.

10. The device of claim 9, wherein the work function material in the second plurality of nanosheet gate-all-round device structures comprises a different material than the work function material in the first plurality of nanosheet gate-all-round device structures.

\* \* \* \* \*